United States Patent [19]

Hieber et al.

[11] Patent Number: 4,543,576
[45] Date of Patent: Sep. 24, 1985

[54] SYSTEM FOR MEASURING ELECTRICAL RESISTANCE AND TEMPERATURE DURING MANUFACTURE OF THIN, CONDUCTIVE FILMS DEPOSITED ON SUBSTRATES BY MEANS OF EVAPORATION OR SPUTTER DEPOSITION

[75] Inventors: Konrad Hieber; Norbert Mayer, both of Munich, Fed. Rep. of Germany

[73] Assignee: Siemens Aktiengesellschaft, Berlin & Munich, Fed. Rep. of Germany

[21] Appl. No.: 381,898

[22] Filed: May 25, 1982

[30] Foreign Application Priority Data

Jun. 12, 1981 [DE] Fed. Rep. of Germany ....... 3123427

[51] Int. Cl.$^4$ ...................... G08C 19/16; C23C 13/02; C23C 15/00
[52] U.S. Cl. ........................... 340/870.17; 340/870.19; 340/870.22; 374/185; 427/8; 204/192 R
[58] Field of Search ...................... 340/870.17, 870.19, 340/870.22; 427/8, 10; 374/185; 29/574, 612; 338/22 SD; 204/192 R, 298

[56] References Cited

U.S. PATENT DOCUMENTS

| 3,039,355 | 6/1962 | Suter | 340/870.17 |
| 3,609,728 | 9/1971 | Quinn | 340/870.17 |
| 4,331,702 | 5/1982 | Hieber | 427/10 |
| 4,332,081 | 6/1982 | Francis | 374/185 |
| 4,422,066 | 12/1983 | Belcourt | 340/870.17 |

FOREIGN PATENT DOCUMENTS 2909804 9/1980 Fed. Rep. of Germany.
3004149 8/1981 Fed. Rep. of Germany.

*Primary Examiner*—James J. Groody
*Attorney, Agent, or Firm*—Hill, Van Santen, Steadman & Simpson

[57] ABSTRACT

A system for measuring electrical resistance and temperature during the manufacture of thin, conductive films deposited on substrates by means of evaporation or sputter-deposition. A deposition unit with an evacuatable load lock chamber and a rotating substrate holder are employed as the deposition system. The specific electrical resistance of the film is measured according to the principle of the two-point or four-point measuring methods at a reference substrate with specific sample geometry and with low-resistance contacts. The substrate temperature is measured by means of resistance thermometers. With the invention, the transmission of the measured data occurs contact-free by means of electro-magnetic radiation, preferably by means of a telemetric pulse code modulation method.

19 Claims, 5 Drawing Figures

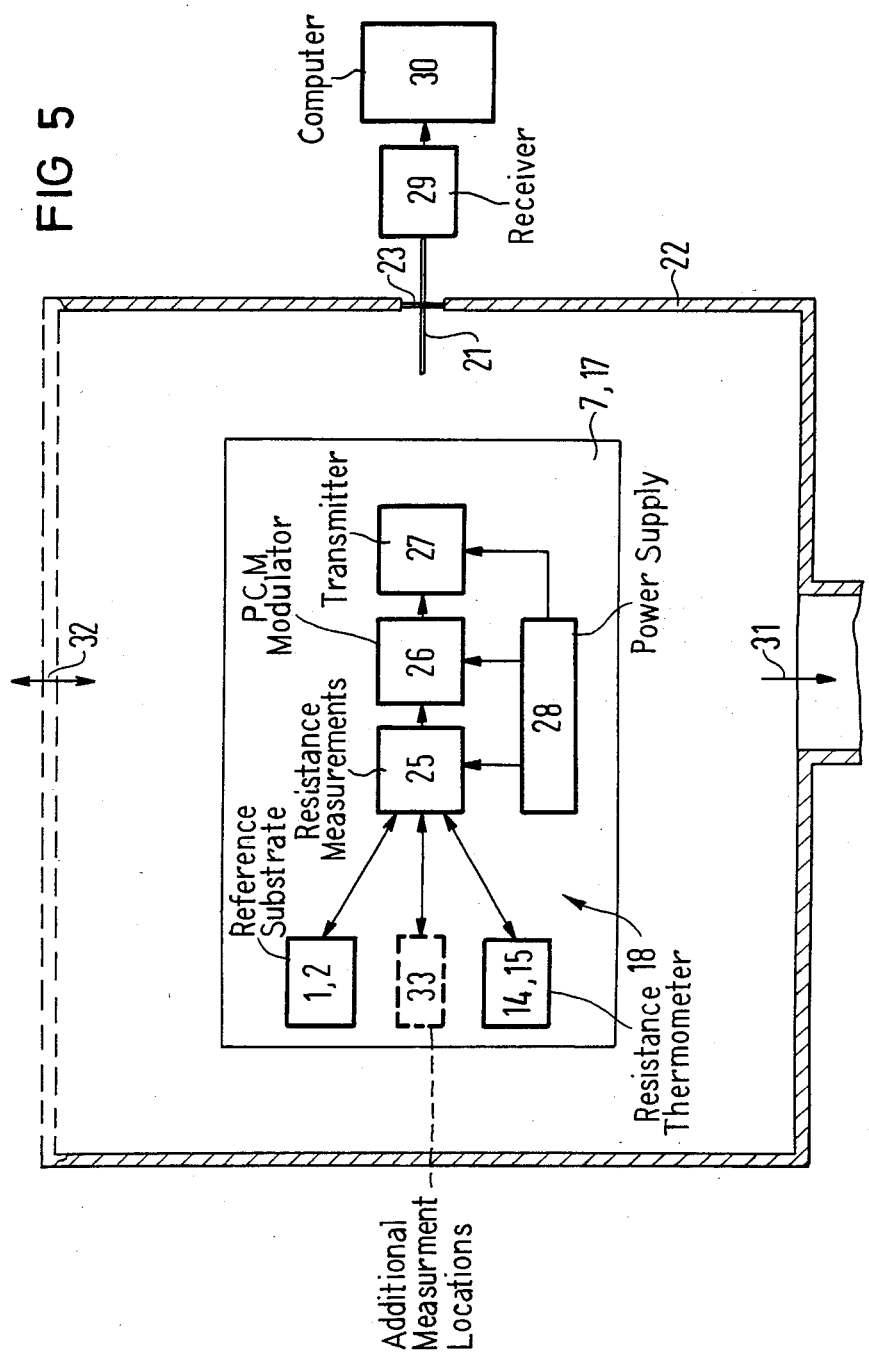

SYSTEM FOR MEASURING ELECTRICAL RESISTANCE AND TEMPERATURE DURING MANUFACTURE OF THIN, CONDUCTIVE FILMS DEPOSITED ON SUBSTRATES BY MEANS OF EVAPORATION OR SPUTTER DEPOSITION

BACKGROUND OF THE INVENTION

The invention relates to a system for measuring the electrical resistance and the temperature of thin, metallically conductive films deposited on substrates by means of evaporation or sputter-deposition. These measurements are carried out during the film manufacture. An evacuated processing or deposition unit with an evacuatable load lock chamber is employed in the coating. The substrate holder is designed to be movable. The electrical resistance of the film is measured according to the principle of the known two-point or four-point measuring method on a reference substrate with a specific sample geometry and by use of low-resistance contacts. The substrate temperature is measured by means of a resistance thermometer.

In the manufacture of thin, metallically conductive layers, for example for conduction lines in semicondcutor technology or for resistance layers in thin film technology, high demands are made as to the tolerance and stability of the electrical properties. Thus, the absolute values of the electrical sheet resistances of, for example, thin resistors consisting of, for example Cr—Ni, Al—Ta, Cr—Si, may vary only by a few percentage points from charge to charge, and the temperature coefficient of the electrical resistance may often amount to only a few $\mu 10^{-6} K^{-1}$. Furthermore, the resistance value of the films which are often only 10 nm thick may change only by a few percentage points over a number of years.

In order to achieve this high reproducibility, the residual gas pressure in the evaporation or, respectively, sputter deposition systems must be better than $10^{-6}$ mbar. In order to maintain such a low residual gas pressure even under fabricating conditions, i.e. short cycle time and high substrate throughout, evaporation and sputter deposition systems with vacuum load locks are employed, i.e. the substrates are mounted on a substrate holder such as a pallet with the load lock open. They are subsequently transported into the actual deposition chamber by means of the pallet with the load lock closed—after the load lock reaches a specific final pressure. Such a deposition system with a load lock chamber is known from German OS No. 29 29 804, incorporated herein by reference. The substrates must still be moved during the deposition in order to attain the necessary homogeneity of the layer. This means that there is no specific or fixed position of a substrate in the deposition chamber.

In order to be able to precisely determine the end of the deposition process, a resistance measurement during the deposition would be of great technical advantage. Accordingly, one could measure the attainment of the required electrical values, for example of the sheet resistance. Moreover, it would even be possible to follow and appropriately control the film growth practically from the first monolayer, as is proposed in German patent application No. P 30 04 149.7, corresponding to U.S. Ser. No. 231,885 now U.S. Pat. No. 4,331,702 filed Feb. 5, 1981, and incorporated herein by reference.

Since the substrate temperature during the deposition (20° C. through 500° C.) can noticeably influence both the electrical properties as well as the stability of the film, knowledge of this type is also of significance for a reproducible deposition process.

SUMMARY OF THE INVENTION

An object underlying the invention is to create a measuring arrangement with which it is possible to determine the electrical resistance during the deposition process while maintaining the following conditions:

(a) a system with load lock chamber must be employed, (b) the substrate pallet is moved in order to obtain a homogeneous film, and (c) the substrate temperature (up to 500° C.) can be measured simultaneously with the measurement of the electrical resistance.

This measuring arrangement should also be useful when ions and/or electrons strike the substrate during the deposition process.

Resistance measurement in the evaporation or, respectively cathode sputter systems during the deposition was previously achieved in various ways. The first possibility is that a stationary reference substrate is employed, whereby an allocation between the electrical values of the substrate being moved and the reference substrate is determined in many tests. A further possibility consists of measuring the resistance at the moved substrate by means of wiper contacts. This method, however, is only successful when the substrates assume a specific position in the deposition chamber. This is the case given systems without a load lock or when the substrates rotate around an axle, whereby the substrate holder is rigidly connected to the axis of rotation. Given similar preconditions, only one method is also employable in which a moved substrate is contacted by means of flexible wires. There, however, the direction of rotation must be frequently changed during the deposition, so that the wound wires can again unwind.

Infrared radiation measuring installations are presently employed for contact-free measurement of the substrate temperature during the film deposition. Accordingly, problems derive concerning the measuring precision, since the glass fiber optics are also partially coated.

The invention achieves the above object by means of a measuring installation of the type described previously and wherein the measuring system is mounted on the movable substrate holder as an independent unit and the transmission of the measured data ensues contact-free by means of electro-magnetic radiation. Accordingly, it lies within the framework of the invention that the transmission of the measured data ensues by means of a telemetry system in the pulse code modulation (PCM) method.

According to a particularly advantageous sample embodiment of the invention, the measuring installation consists of (a) resistance measurement device, containing a constant current source, which applies a constant current to the resistance to be measured and by which a voltage drop across the resistance is generated and a device for measuring this voltage drop.

(b) a converter (PCM modulator=multiplexer and encoder) which cyclically senses the individual measuring locations (reference substrate, temperature) and converts the analog measured voltage into digital signals;

(c) a transmitter which, together with the resistance measurement device, the converter as well as the power supply, is disposed as an independent measuring system on or below the movable substrate holder;

(d) a reception antenna which is attached in insulated fashion to the inside of the deposition chamber; and (e) a receiver which is disposed outside of the deposition chamber and which makes the signal decoding.

A high frequency transmitter with an antenna, inductive or capacitive coupling between the substrate pallet and the deposition chamber, or an infrared transmitter with an infrared receiver for reception are employed for the telemetric transmission of the measured data.

It is provided in a further development of the invention when the measured data already exist in digital form, that they are directly accepted by a process control computer which takes over their immediate analysis.

According to a sample embodiment of the invention, the above mentioned overall measuring system (consisting of resistance measurement device, converter, transmitter and power supply) is constructed in a miniaturized format, so that it can be secured to the substrate holder without a significant disruption of the geometry. Given the miniaturized format, the passive elements of the circuit such as, for example, conduction lines, resistors, capacitances and inductances, are applied to ceramic or glass substrates in thick film or, respectively, thin film technology. The layer thickness of these elements lies between 10 nm and 5000 nm. The active elements such as, for example, diodes or transistors, are subsequently integrated into the film circuit. Further, the measuring system is constructed in such manner that a contamination of the vacuum in the deposition chamber unit due to evaporation of atoms from the measuring system is avoided. This can be achieved either by the employment of special materials and components or by means of encapsulating all parts. By means of a suitable thermally insulating assembly to the side of the substrate holder which faces away from a heat source which may be present, the measuring system can also be employed given higher deposition temperatures. The power supply of the measuring system can ensue either via a battery or via a single wiper contact from the outside, or via a solar cell which is fed via the plasma luminescence.

BRIEF DESCRIPTION OF THE DRAWINGS

FIG. 5 illustrates the functional interrelationship of the measuring system and its disposition in, or respectively relative to, the coating system.

DESCRIPTION OF THE PREFERRED EMBODIMENTS

As a sample embodiment, the measuring arrangement for a cathode sputter system with a planar substrate holder is described. In this sample embodiment, the coating and heating of the substrates ensues from above.

Figure 1:
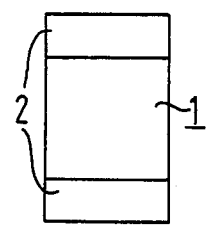
FIG. 1 illustrates in plan view the reference substrate provided for the measurement.

The measurement of the electrical resistance of the deposited film ensues at a reference substrate 1 which is provided with low-resistance contacts 2 (see FIG. 1).

As can be seen from FIG. 2, four measuring contacts 3, 4, 5, and 6 are attached to the reference substrate for measuring the electrical resistance according to the four-point method, said measuring contacts being introduced from below through the substrate pallet 7 and resting on the low-resistant contacts 2 which have already been applied. The measurement can also be carried out according to the two-point measuring method with the assistance of direct current or alternating current. Given a dc resistance measurement, a constant current is applied to the resistance to be measured (typically, between 0.1 $\mu A$ and 10 mA). The voltage drop across the resistance is supplied to the converter (PCM modulator) as the measured variable. Filters and an amplifier can also be preconnected to the PCM modulator in order to achieve a better measuring signal.

A diaphragm 8 with specific dimensions is attached above the reference substrate 1, so that the reference substrate 1 is coated with a fixed geometry. The diaphragm 8 must be constructed in such manner that no electrical short-circuit can occur between the diaphragm and the film to be measured (see FIG. 4 as well). Depending on the specific electrical resistance of the material to be measured, the absolute size of the resistance to be measured can be adjusted via the geometry of the diaphragm 8.

Figure 3:
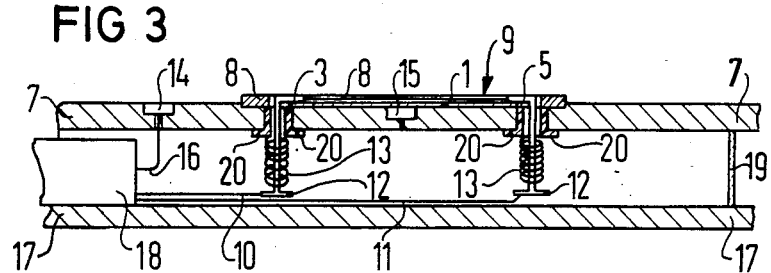
FIGS. 3 and 4 illustrate sectional views through the double pallet with the reference substrate and measuring system according to FIG. 2.

As can be seen from FIG. 3, the reference substrate 1 lies in a depression (see arrow 9) of the pallet 7. The instrument leads 10, 11 for the resistance measurement are brought to the reference substrate 1 from below through the pallet 7 carrying the reference substrate 1 by use of clamps 12 with springs 13, and there rest against the low-resistant contacts 3 and 5 which have already been applied. By so doing, the reference substrate 1 is fixed on the substrate pallet 7. The measurement of the temperature ensues with the assistance of resistance thermometers 14 and 15 which are attached to the pallet surface 7 from below via instrument lead 16. The measuring system 18 for measuring the electrical resistances, (consisting of resistance measurement device converter (PCM modulator), transmitter and power supply), is applied underneath the substrate pallet 7. For this purpose, a second pallet 17 is secured below the actual substrate pallet 7, said second pallet 17 being connected to the actual substrate pallet 7 only via a few spacing pieces 19 which exhibit poor thermal conductivity. The measuring system 18, including the resistance measurement device, converter, transmitter, and power supply is constructed in miniaturized format; thus, it can exhibit a relatively large lateral extension given an only slight overall height and thus has sufficient space between the two pallets 7 and 17. In the sample embodiment, the overall height of the double pallet system 7, 17 amounts to approximately 20 mm. Insulation materials are indicated with the reference numeral 20.

Figure 2:
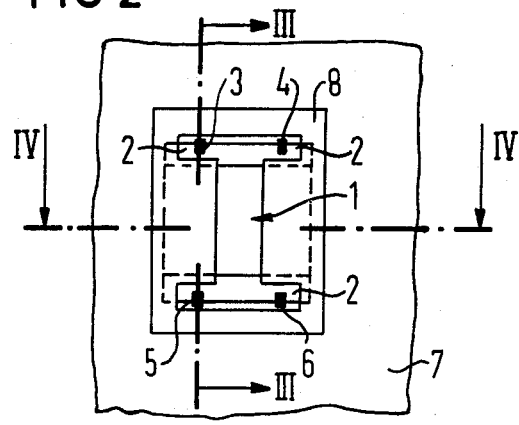
FIG. 2 illustrates in plan view the reference substrate with diaphragm and measuring contacts.
Figure 4:
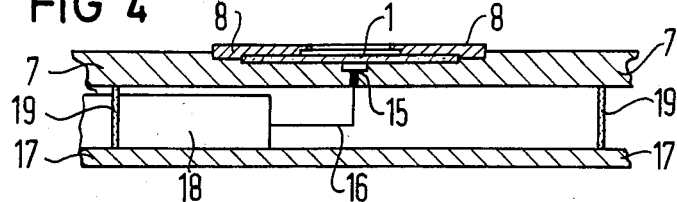

The same reference numerals as in FIGS. 1, 2 and 3 apply in FIG. 4 which represents a sectional view of FIG. 2 in the direction IV—IV.

As can be derived from FIG. 5, the measuring system 18 together with resistance, measurement device 25, converter 26, the transmitter 27 and the power supply 28 built into the double pallet 7, 17, represents an independent system. The transmission of measuring data from the rotating pallet 7, 17 ensues via a telemetric system, whereby the converter which converts the measured voltage which has been measured at the film 1, 2 into pulse code modulation signals capable for transmission is situated below the pallet. The measuring apparatus 18 including the transmitter 27 is operated with a battery 28. With employment of high frequency technology for the measuring data transmission, the reception antenna 21 is attached inside the sputter chamber 22 and is guided out of the sputter chamber 22 via an insulated electrical vacuum feedthrough 23. The receiver unit 29 for decoding the received telemetric data is situated outside of the sputter chamber 22. The measured data can then exist as digital or analog signals for analysis. When the measured data exist in digital form, they can be directly accepted by a computer 30 which makes immediate computation and, if need be, calculates the corrections for the individual film deposition parameters according to patent application No. P 30 04 149.7 incorporated herein by reference, and correspondingly changes the deposition parameters.

The following reference symbols apply in the block diagram illustrated in FIG. 5 over the measuring sequence:

film = 1, 2
resistance thermometer = 14, 15
resistance measurement device = 25
converter = 26 (PCM modulator) = multiplexer and encoder
transmitter = 27
power supply = 28
reception antenna = 21
insulated electrical vacuum feedthrough for antenna = 23
receiver = 29
computer = 30

The single arrow 31 in FIG. 5 indicates the vacuum connection of the sputter chamber system 22, and the double arrow 32 indicates the attached load lock chamber. The region 33 encompassed by the dot-dash line indicates the possibility of further measuring locations.

The individual measuring locations are cyclically sampled in the PCM modulator 26 and the analog value of the measured voltage is converted into a digital value.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A system for measuring electrical resistance and temperature during the manufacture of a thin, conductive film deposited on a substrate by means of evaporation or sputter-deposition, comprising: an evacuated processing unit for deposition of the conductive film and having an evacuatable load lock chamber; a movable substrate holder; a reference substrate; deposited film geometry defining means; means for measuring an electrical resistance of the deposited film on the reference substrate according to a two-point or four-point measuring method, said means for measuring including low-resistance contacts and resistance thermometer means for measuring substrate temperature; and transmitting means for producing and transmitting measured data, obtained in conjunction with the measuring means in a contact-free manner, to an exterior of the processing unit by electro-magnetic radiation; and said means for transmitting being attached as an independent unit to the movable substrate holder.

2. A system according to claim 1 wherein the transmitting means comprises a telemetric system utilizing pulse code modulation (PCM).

3. A system according to claim 1 wherein the transmitting means comprises
   (a) a resistance measurement device containing a constant current source which applies a constant current to the resistance to be measured and a device to measure the generated voltage drop across the resistance to be measured;
   (b) a converter formed of a PCM modulator means which cyclically senses individual measuring locations and converts analog measured voltages into digital signals;
   (c) a transmitter which, together with the resistance measurement device, the converter, as well as a power supply is situated directly adjacent the movable substrate holder;
   (d) a reception antenna attached in insulated fashion to an inside of the processing unit; and
   (e) a receiver positioned outside the processing unit and which decodes received signals.

4. A system according to claim 3 wherein the power supply is coupled to the resistance measurement device, the converter, and transmitter via a wiper contact and is located exterior to the processing unit.

5. A system according to claim 1 wherein the transmitting means includes a high frequency transmitter and a reception antenna introduced into the processing unit through an insulated electrical vacuum feedthrough.

6. A system according to claim 1 wherein the transmitting means comprises an infrared system formed of an infrared transmitter and a sensor sensitive to infrared radiation as a reception antenna.

7. A system according to claim 1 wherein the transmitting means includes a receiver coupled to a process control computer means for acceptance of digital data of measured resistance and temperature.

8. A system according to claim 1 wherein the transmitting means comprises a resistance measurement device, a converter, a transmitter, and a power supply all constructed in miniaturized format and thermally insulated.

9. A system according to claim 1 wherein the transmitting means is encapsulated in vacuum-tight fashion.

10. A system according to claim 1 wherein the substrate holder is designed as a double pallet, one of the pallets containing the reference substrate and the other pallet spaced from the first pallet by spacer pieces having the transmitting means mounted thereon on a side facing the first pallet.

11. A system according to claim 1 wherein the reference substrate is fixed on the substrate holder by spring loaded measuring contacts.

12. A system according to claim 1 wherein the resistance thermometer means are disposed directly below the reference substrate.

13. A system according to claim 1 wherein a plurality of reference substrates and a plurality of temperature locations are connected to the transmitting means.

14. A system according to claim 1 wherein electrical filter means are provided for elimination of high frequency interference occurring during sputter-deposition of the conductive films.

15. A system according to claim 1 wherein the transmitting means includes an amplifier connected to amplify analog measured voltages from a resistance measurement device in the transmitting means.

16. A system according to claim 1 wherein a power supply for the transmitting means comprises batteries.

17. A system for measuring electrical resistance during manufacture of thin, conductive films deposited on a substrate by means of evaporation of sputter-deposition in an evacuated processing unit, comprising: a movable substrate holder; a reference substrate on the holder; electrode means for measuring an electrical resistance of a deposited film on the reference substrate; and transmitting means physically connected to the movable substrate and electrically connected to the electrodes for making resistance measurements and transmitting the measurements to an exterior of the processing unit by electromagnetic radiation.

18. A system according to claim 17 wherein the movable substrate holder comprises first and second spaced apart pallets, the first pallet having the reference substrate thereon on to which the film is evaporated or sputter-deposited and the other pallet has the transmitting means mounted thereon.

19. The system of claim 18 wherein the electrodes comprise spring loaded contacts extending between the two pallets.

* * * * *